(12) United States Patent
Kondoh

(10) Patent No.: US 8,280,545 B2
(45) Date of Patent: Oct. 2, 2012

(54) VACUUM PROCESSING APPARATUS AND METHOD, AND STORAGE MEDIUM FOR EXECUTING THE METHOD

(75) Inventor: Keisuke Kondoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1157 days.

(21) Appl. No.: 12/025,326

(22) Filed: Feb. 4, 2008

(65) Prior Publication Data

US 2008/0187413 A1 Aug. 7, 2008

(30) Foreign Application Priority Data

Feb. 5, 2007 (JP) ................................. 2007-025944

(51) Int. Cl.
*G06F 7/00* (2006.01)
(52) U.S. Cl. ........................................ 700/214; 700/229
(58) Field of Classification Search .................. 700/229, 700/228, 214; 414/935, 936
See application file for complete search history.

(56) References Cited

U.S. PATENT DOCUMENTS

| 2004/0031340 A1* | 2/2004 | Renken .......................... 73/866.1 |
| 2004/0158347 A1* | 8/2004 | Sha et al. ....................... 700/218 |
| 2005/0203664 A1* | 9/2005 | Schauer et al. ............... 700/213 |

FOREIGN PATENT DOCUMENTS

| JP | H04-298061 A | 10/1992 |
| JP | 09148414 A | 6/1997 |
| JP | 2000-58628 A | 2/2000 |
| JP | 2000058628 A | 2/2000 |
| JP | 2000-252350 A | 9/2000 |
| JP | 2002-261154 A | 9/2002 |
| JP | 2003179120 A | 6/2003 |
| JP | 2003344037 A | 12/2003 |
| JP | 2004-128022 A | 4/2004 |
| JP | 2005-93880 A | 4/2005 |
| JP | 2005175413 A | 6/2005 |
| JP | 2006-351883 A | 12/2006 |
| KR | 1999-0071449 B1 | 9/1999 |

OTHER PUBLICATIONS

Japanese Office action for Application No. 2007-025944 dated Nov. 4, 2008.
Korean Office action for Appl. No. 10-2008-0011077 dated Oct. 21, 2009.
Japanese Office action for Appl. No. 2007-025944 dated Nov. 17, 2009.
Japanese Office action for 2007-025944 dated Aug. 31, 2010.
Japanese Office action for 2010-267572 dated Nov. 1, 2011.

\* cited by examiner

*Primary Examiner* — Ramya Burgess
(74) *Attorney, Agent, or Firm* — Pearne & Gordon LLP

(57) ABSTRACT

A vacuum processing apparatus transfers a wafer between a first transfer arm and a second transfer arm via a rotary stage; acquires position data of a peripheral portion of the wafer by using a line sensor while rotating the rotary stage sustaining the wafer before a vacuum process thereon; calculates a center position and a direction of the wafer based on the position data; controls a rotation of the rotary stage to adjust the direction of the wafer based on the calculation result; and controls the second transfer arm such that the second transfer arm conveys the wafer to a wafer mounting member inside a vacuum processing chamber while allowing a center of the wafer to be aligned to a center of the mounting member based on the calculation result.

11 Claims, 13 Drawing Sheets

VACUUM PROCESSING APPARATUS AND METHOD, AND STORAGE MEDIUM FOR EXECUTING THE METHOD

FIELD OF THE INVENTION

The present disclosure relates to a vacuum processing apparatus for performing a vacuum process on a semiconductor wafer in a vacuum processing chamber after transferring the semiconductor wafer into the vacuum processing chamber via a preliminary vacuum chamber and a vacuum transfer chamber under a normal pressure atmosphere; and also pertains to a vacuum processing method performed by using the vacuum processing apparatus and a storage medium for executing the method.

BACKGROUND OF THE INVENTION

A manufacturing process of a semiconductor device includes a process of performing a vacuum process such as an etching process, a film forming process, an ashing process, or the like on a wafer which is a semiconductor substrate. Known as an apparatus to be used to perform these vacuum processes is a multi-chamber type vacuum processing apparatus having a configuration which connects a plurality of vacuum processing chambers to a common transfer chamber under a vacuum atmosphere and also connects the vacuum transfer chamber to a transfer chamber under an atmospheric pressure via a preliminary vacuum chamber serving as a load lock chamber.

Such vacuum processing apparatus is illustrated in FIG. 14. A wafer in a carrier 10 is taken out by a first transfer arm 12 in a transfer chamber 11 under a normal pressure atmosphere, and then is transferred by the first transfer arm 12 into a preliminary vacuum chamber 13 under a normal pressure atmosphere. Subsequently, after the atmosphere inside the preliminary transfer chamber 13 is turned into a specific vacuum atmosphere, the wafer is taken out of the preliminary vacuum chamber 13 by a second transfer arm 14, and is conveyed into a certain vacuum processing chamber 16, where a desired vacuum process is performed on the wafer, via a vacuum transfer chamber 15. Thereafter, the wafer is transferred into the preliminary vacuum chamber 13 under the vacuum atmosphere by the second transfer arm 14 via the vacuum transfer chamber 15. Then, after the atmosphere inside the preliminary vacuum chamber 13 is turned into a normal pressure atmosphere, the wafer is returned back into the carrier 10 by the first transfer arm 12 via the transfer chamber 11.

In the vacuum processing apparatus described above, a position alignment of the wafer is performed before the wafer is transferred into the vacuum processing chamber 16. For example, in the above-described vacuum processing apparatus, a position alignment mechanism 17 is connected to the transfer chamber 11. In such configuration, the wafer taken out of the carrier 10 by the first transfer arm 12 is transferred to the position alignment mechanism 17, and upon the completion of the position alignment, the wafer is conveyed into the preliminary vacuum chamber 13 by the first transfer arm 12.

However, if the position alignment mechanism 17 is disposed in an atmospheric transfer area, the first transfer arm 12 needs to perform the transfer of the wafer between as many as three locations: the carrier 10, the preliminary vacuum chamber 13 and the position alignment mechanism 17. Thus, the first transfer arm 12 suffers a great load, and a transfer throughput is deteriorated. Furthermore, since the wafer is conveyed from the first transfer arm 12 to the preliminary vacuum chamber 13, from the preliminary vacuum chamber 13 to the second transfer arm 14, and from the second transfer arm 14 to the vacuum processing chamber 16 in sequence, a wafer transfer is carried out between the first and second transfer arms 12 and 14 until the wafer reaches the vacuum processing chamber 16, and the number of times of wafer transfer increases. Therefore, there is a high likelihood that a misalignment of the wafer would take place while the wafer is being transferred, so it is apprehended that alignment accuracy of the wafer may be deteriorated when the wafer is conveyed into the vacuum processing chamber 16.

Meanwhile, there is also known a configuration in which a position alignment mechanism is installed in, for example, a vacuum transfer chamber. In such configuration, a second transfer arm provided in the vacuum transfer chamber conveys a wafer from a preliminary vacuum chamber into the vacuum transfer chamber and then transfers the wafer into the position alignment mechanism. After a position alignment of the wafer is completed, the wafer is transferred into a specific vacuum processing chamber by the second transfer arm. Accordingly, even in case that the position alignment mechanism is installed in a vacuum transfer area, the second transfer arm still has to perform the wafer transfer with respect to three locations: the preliminary vacuum chamber, the position alignment mechanism and the vacuum processing chamber. Thus, as in the case of installing the position alignment mechanism in the atmospheric transfer area, a deterioration of a throughput of the apparatus is inevitable.

Meanwhile, the wafer may sometimes need to be cooled or heated in the preliminary vacuum chamber for a subsequent process. Patent Reference 1 discloses a technique of cooling the wafer by introducing a gas into a sealed space where the wafer is maintained and of heating the wafer by means of a heating lamp disposed above the wafer. However, Patent Reference 1 is not conceived or adapted to solve the above-mentioned problems. That is to say, the problems cannot be solved by the configuration of Patent Reference 1.

[Patent Reference 1]
Japanese Patent Laid-open Application No. H11-214478 (FIG. 3)

BRIEF SUMMARY OF THE INVENTION

In view of the foregoing, the present disclosure provides a technique capable of increasing a throughput of a vacuum processing apparatus by reducing a load of a transfer arm and, also, capable of transferring a wafer into a vacuum processing chamber with a high alignment accuracy.

In accordance with a first aspect of the present invention, there is provided a vacuum processing apparatus for performing a vacuum process on a wafer, which is a semiconductor substrate, in a vacuum processing chamber, the apparatus capable of transferring the wafer with respect to a preliminary vacuum chamber by a first transfer arm disposed under a normal pressure atmosphere and also capable of transferring the wafer between the preliminary vacuum chamber and the vacuum processing chamber by a second transfer arm disposed in a vacuum transfer chamber, the preliminary vacuum chamber being switchable between a normal pressure atmosphere and a vacuum atmosphere, wherein the preliminary processing apparatus includes: a temperature control plate for sustaining the wafer thereon while controlling a temperature thereof; and a rotary stage configured to be revolvable about a vertical axis while sustaining the wafer thereon and vertically movable between a raised position where the rotary stage maintains the wafer above the temperature control plate and a lowered position where the rotary stage is sunk inside the temperature control plate while allowing the wafer to be placed on the temperature control plate, the rotary stage allowing the wafer to be transferred with respect to the first and the second transfer arms, and wherein the vacuum processing apparatus includes: a position data acquiring unit for acquiring position data of a peripheral portion of the wafer placed on the rotary stage; a first operation module for calculating a center position and a direction of the wafer based on the position data acquired by the position data acquiring unit; and a control module for controlling a rotation of the rotary stage to adjust the direction of the wafer based on the calculation result and for controlling the second transfer arm such that the second transfer arm conveys the wafer to a wafer mounting member inside the vacuum processing chamber while allowing a center of the wafer to be aligned to a center of the mounting member based on the calculation result.

In the first aspect of the present invention, the temperature control plate may be a cooing plate for cooling the vacuum-processed wafer placed thereon. Further, the position data acquiring unit includes a detector for detecting a position of the peripheral portion of the wafer prior to the vacuum process while the wafer is being rotated by the rotary stage, and the position data may be data which relate a position of the peripheral portion of the wafer to a rotational position of the wafer in a rotational direction.

Moreover, the position data acquiring unit includes a detector for detecting positions of at least three locations on the peripheral portion of the vacuum-processed wafer placed on the temperature control plate, and the vacuum processing apparatus may further include: a second operation module for calculating a center position of the wafer based on the position data acquired by the position data acquiring unit; and a first transfer arm control module for controlling the first transfer arm based on the calculation result of the second operation module so that the wafer is placed on a mounting position set on the first transfer arm.

Furthermore, the position data acquiring unit may include a light emitting part disposed above or below the rotary stage and a light receiving part disposed below or above the temperature control plate and placed on an optical axis of the light emitting part, and the temperature control plate may include a light transmitting part for transmitting light from the light emitting part. In addition, the rotary stage may include a plurality of rod-shaped members extended from a center of rotation in a radial manner, and the temperature control plate may be a heating plate for preliminarily heating the wafer placed thereon prior to the vacuum process.

In accordance with a second aspect of the present invention, there is provided a vacuum processing method for performing a vacuum process on a wafer, which is a semiconductor substrate, in a vacuum processing chamber, the apparatus capable of transferring the wafer with respect to a preliminary vacuum chamber by a first transfer arm disposed under a normal pressure atmosphere and also capable of transferring the wafer between the preliminary vacuum chamber and the vacuum processing chamber by a second transfer arm disposed in a vacuum transfer chamber, the preliminary vacuum chamber being switchable between a normal pressure atmosphere and a vacuum atmosphere, the method including: loading the wafer into the preliminary vacuum chamber by the first transfer arm and placing the wafer on a rotary stage disposed above a temperature control plate; acquiring position data of a peripheral portion of the wafer by means of a position data acquiring unit while the wafer is rotated by the rotary stage; calculating a direction of the wafer based on the position data of the peripheral portion of the wafer and controlling a rotation of the rotary stage to adjust the direction of the wafer; and calculating a center position of the wafer based on the position data of the peripheral portion of the wafer and controlling the second transfer arm such that the second transfer arm conveys the wafer to a wafer mounting member inside the vacuum processing chamber while allowing a center of the wafer to be aligned to a center of the mounting member.

In the second aspect of the present invention, the step of acquiring the position data of the peripheral portion of the wafer may be performed while the preliminary vacuum chamber is being depressurized. Further, the vacuum processing method may further include: loading the vacuum-processed wafer into the preliminary vacuum chamber by the second transfer arm and placing the wafer on the rotary stage disposed above the temperature control plate; and conveying the vacuum-processed wafer onto the temperature control plate by lowering the rotary stage and cooling the wafer placed on the temperature control plate. Furthermore, the vacuum processing method may further include: placing the vacuum-processed wafer on the temperature control plate and acquiring position data of at least three locations on the peripheral portion of the wafer; and calculating a center position of the wafer based on the position data and controlling the first transfer arm so that the wafer is placed on a mounting position set on the first transfer arm.

In accordance with a third aspect of the present invention, there is provided a computer-readable storage medium for storing therein a computer-executable computer program to be used in a vacuum processing apparatus which performs a vacuum process on a wafer, which is a semiconductor substrate, in a vacuum processing chamber by transferring the wafer into the vacuum processing chamber via a preliminary vacuum chamber switchable between a normal pressure atmosphere and a vacuum atmosphere, and a vacuum transfer chamber, wherein the computer program executes steps of the vacuum processing method.

In accordance with the present disclosure described above, the wafer is loaded on the rotary stage in the preliminary vacuum chamber by the first transfer arm under a normal pressure atmosphere, and the position data acquiring unit obtains the position data of the peripheral portion of the wafer mounted on the rotary stage. Then, based on this position data, an alignment of the direction of the wafer is carried out. Then, the second transfer arm in the vacuum transfer chamber conveys the wafer from the rotary stage into the mounting member inside the vacuum processing chamber, while performing an alignment of the center of the wafer. Therefore, the first and second transfer arms are allowed to have a small number of access positions, so that loads upon the first and second transfer arms can be reduced. As a consequence, a throughput can be enhanced. Besides, since the wafer whose center and direction have been adjusted is directly conveyed into the vacuum processing chamber after taken out from the preliminary vacuum chamber by the second transfer arm, it is possible to transfer the wafer into the vacuum processing chamber with a high alignment accuracy.

BRIEF DESCRIPTION OF THE DRAWINGS

The disclosure may best be understood by reference to the following description taken in conjunction with the following figures.

DETAILED DESCRIPTION OF THE EMBODIMENTS

Figure 1:
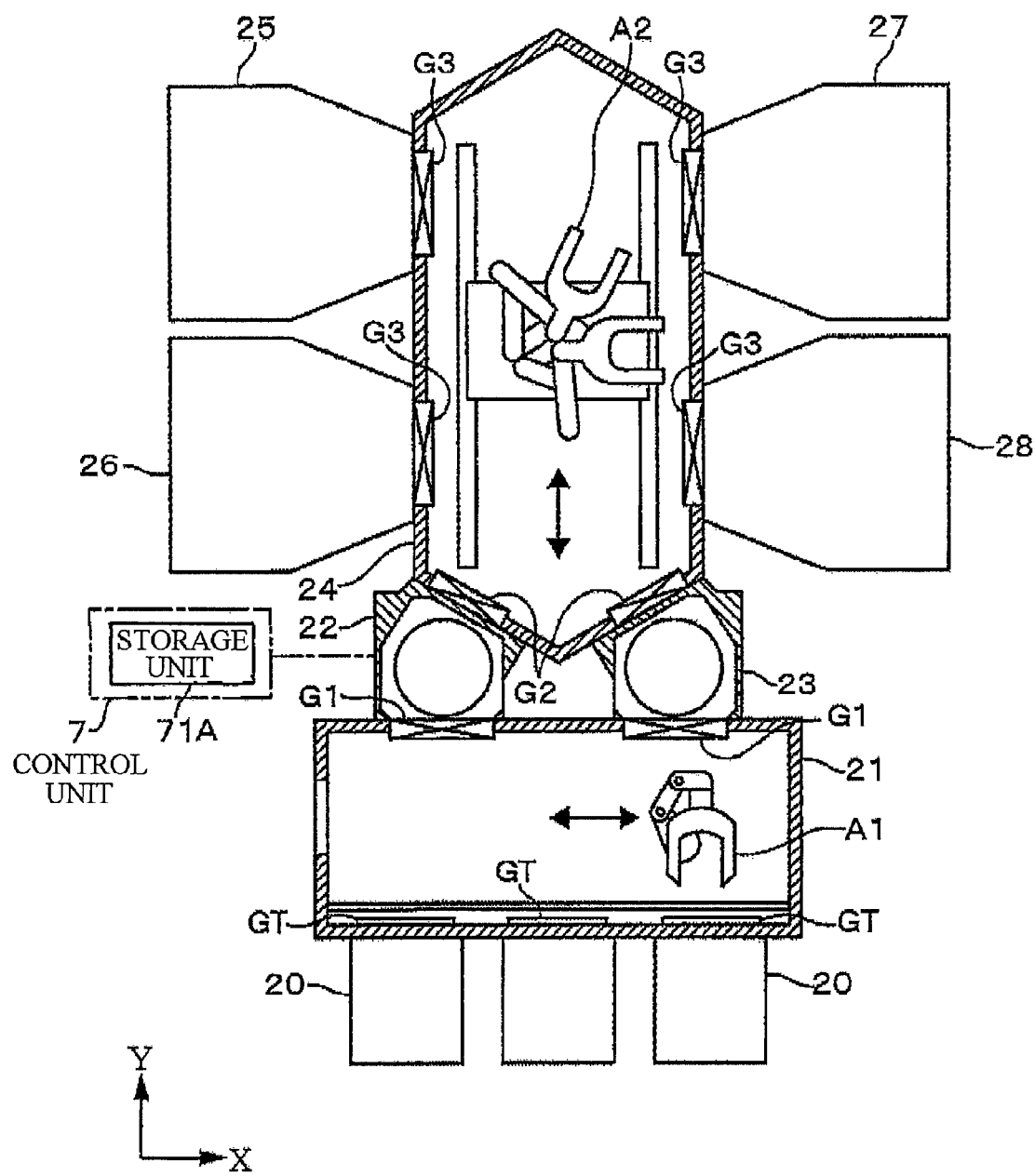
FIG. 1 is a plan view showing a vacuum processing apparatus in accordance with an embodiment of the present invention.

Hereinafter, an embodiment of the present invention will be described with reference to FIG. 1. In FIG. 1, a reference numeral 20 denotes a plurality of, for example, three airtight carriers, each for accommodating a number of wafers W therein. The carriers 20 are respectively connected to a wall portion of one side of a first transfer chamber 21 via doors GT to be arranged in X direction of the figure. Further, two preliminary vacuum chambers 22 and 23 are also connected to, for example, an opposite wall portion of the first transfer chamber 21 via respective gate valves G1 to be arranged in the X direction, the opposite wall portion being opposite to the wall portion where the carriers 20 are connected.

The first transfer chamber 21 is regulated to be under a normal pressure atmosphere. The normal pressure atmosphere may be an atmospheric atmosphere or a normal pressure atmosphere of a nonreactive gas. Further, a first transfer arm A1 is disposed in the first transfer chamber 21 to transfer the wafers W with respect to the carriers 20 and the preliminary vacuum chambers 22 and 23. The first transfer arm A1 is configured to be movable in an arrangement direction (X direction of FIG. 1) of the carriers 20, elevatable in a vertical direction, revolvable about a vertical axis and also movable forward and backward, for example.

The preliminary vacuum chambers 22 and 23 are used as load lock chambers for adjusting atmosphere for the transfer of the wafers W. A second transfer chamber 24 configured as a vacuum chamber is coupled to the preliminary vacuum chambers 22 and 23 via respective gate valves G2. Further, a plurality of, for example, four vacuum processing chambers 25 to 28 are coupled to the second transfer chamber 24 via respective gate valves G3. For example, a film forming apparatus, an annealing apparatus, an etching apparatus, and the like are used as the vacuum processing chambers 25 to 28.

A second transfer arm A2 is disposed in the second transfer chamber 24 to transfer the wafers W with respect to the preliminary vacuum chambers 22, 23 and the vacuum processing chambers 25 to 28. The second transfer arm A2 is movable in Y direction of FIG. 1, elevatable in a vertical direction, revolvable about a vertical axis, and also movable forward and backward, for example. Accordingly, the wafers W are transferred to and from the preliminary vacuum chambers 22 and 23 by the first transfer arm A1 via the gate valves G1 and by the second transfer arm A2 via the gate valves G2.

Figure 2:
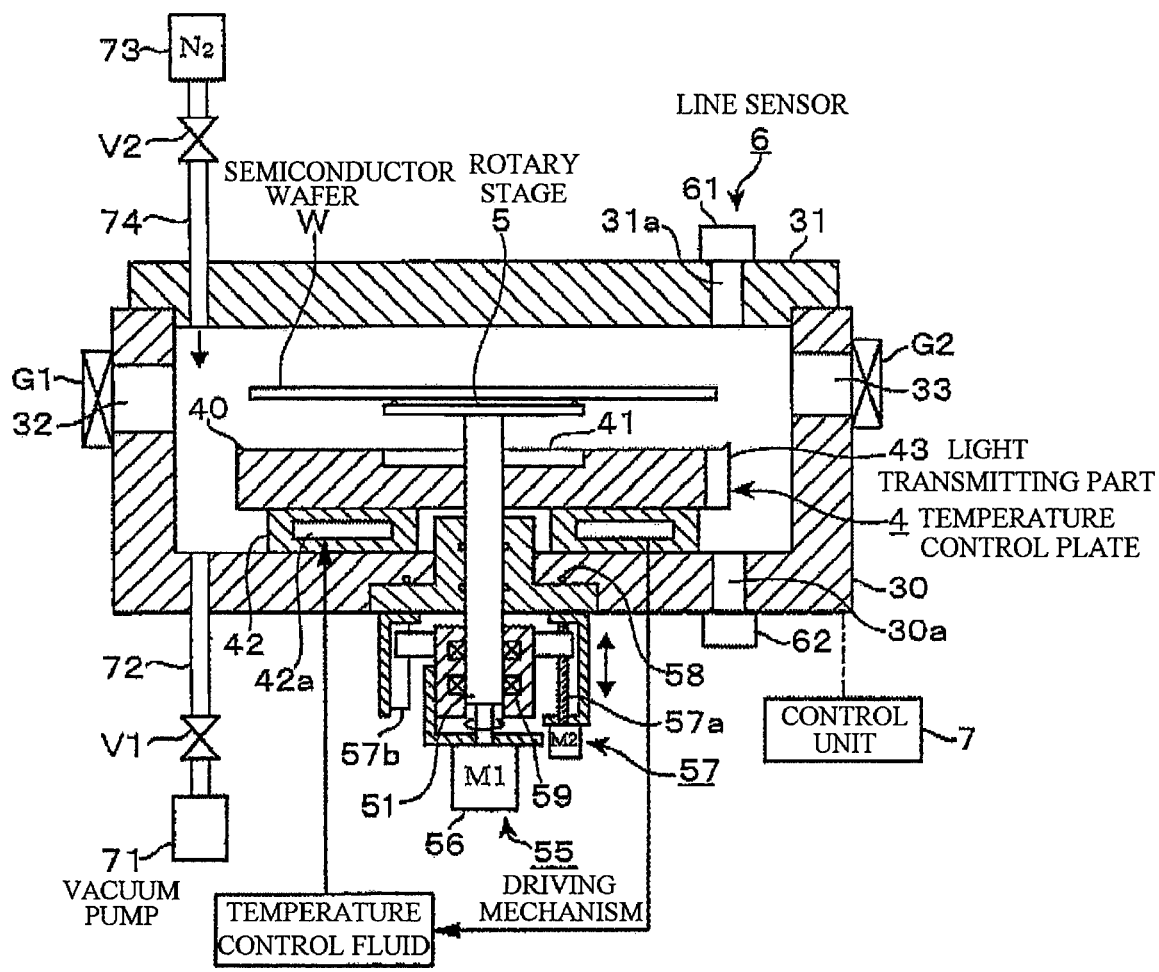
FIG. 2 sets forth a cross sectional view showing an example preliminary vacuum chamber disposed in the vacuum processing apparatus.
Figure 3A:
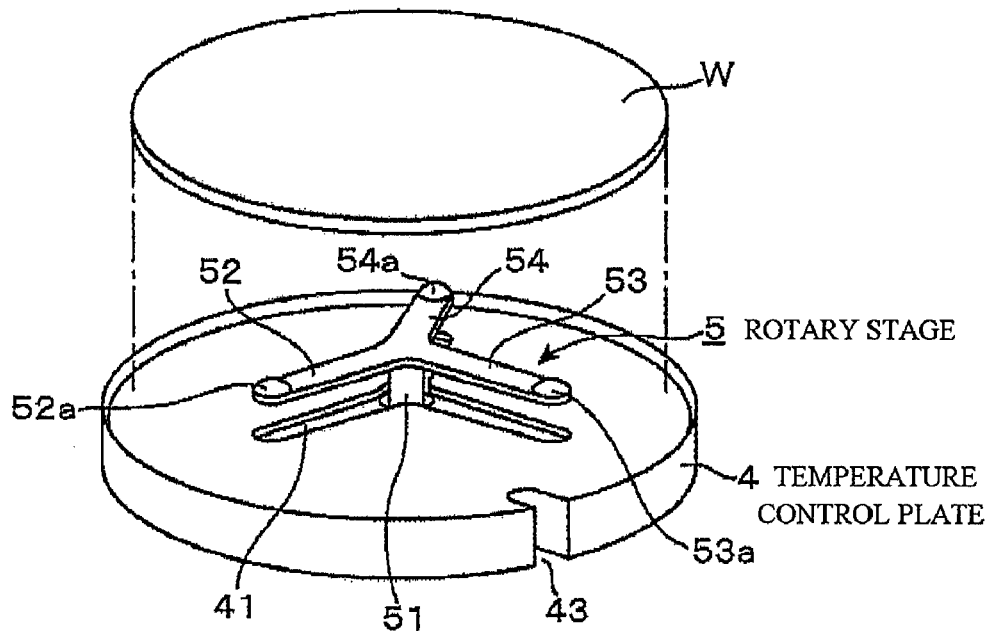
FIGS. 3A and 3B present a perspective view and a plan view showing a temperature control plate and a rotary stage disposed in the preliminary vacuum chamber, respectively.
Figure 3B:
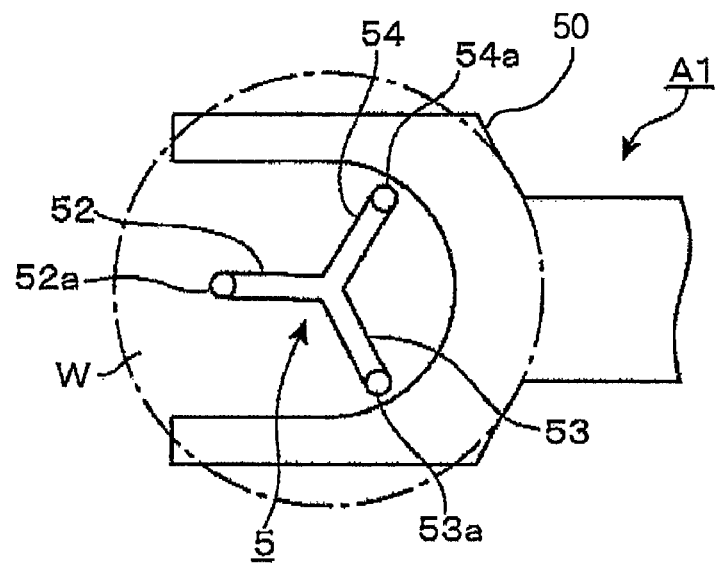

Below, the preliminary vacuum chambers 22 and 23 will be explained in further detail with reference to FIGS. 2, 3A and 3B. Referring to FIG. 2, a reference numeral 30 denotes a chamber, and a reference numeral 31 denotes a cover for closing a top opening of the chamber 30. Provided in a sidewall of the chamber 30 are an opening 32 communicating with the firth transfer chamber 21 and an opening 33 communicating with the second transfer chamber 22. The openings 32 and 33 are opened or closed by the gate valves G1 and G2, respectively.

A temperature control plate 4 having, for example, a circular plate shape is disposed inside the chamber 30 to control the temperature of a wafer W, which is a semiconductor substrate, by mounting the wafer W on a top surface thereof. A temperature control of the temperature control plate 4 is carried out by, for example, a temperature control mechanism 42 provided in contact with a bottom portion of the temperature control plate 4. The temperature control mechanism 42 controls the temperature of the temperature control plate 4 by, for example, flowing a temperature control fluid of a specific temperature into a flow path 42a. Thus, the temperature control plate 4 is used as a cooling plate when cooling the wafer W, and is used as a heating plate when heating the wafer W, as will be explained later.

Further, a driving shaft 51 is installed to pass through a substantially center of the temperature control plate 4, and a rotary stage 5 is mounted on a top surface of the driving shaft 51. The rotary stage 5 is configured to rotate about a vertical axis while supporting a rear surface of the wafer W above the temperature control plate 4. The rotary stage 5 is used for the transfer of the wafer W between the first and second transfer arms A1 and A2 and for the transfer of the wafer W onto the temperature control plate 4 as well.

Thus, the shape of the rotary stage 5 is designed so as not to interfere with the movements of the transfer arms A1 and A2 when the wafer W is transferred between the first and second transfer arms A1 and A2. For instance, in the shown example in FIGS. 3A and 3B, the rotary stage 5 is formed by attaching, to the driving shaft 51 serving as a center of rotation, three support arms 52 to 54 which constitute a plurality of rod-shaped members extending from the driving shaft 51 toward the periphery of the temperature control plate 4 in a radial shape. The support arms 52 to 54 are provided with prominences 52a to 54a on their leading ends, and the wafer W is placed on the prominences 52a to 54.

As for the first and second transfer arms A1 and A2, detailed explanation of their configuration will be provided with respect to the transfer arm A1 only, for the simplicity of explanation. The first transfer arm A1 is configured to hold the wafer W by means of, for example, a fork 50 having two arms. The dimension and the shape of the rotary stage 5 are determined such that it can be located inside the fork 50.

A lower end of the driving shaft 51 is connected to a driving mechanism 55 underneath the chamber 30 through a bottom wall of the chamber 30. The driving mechanism 55 includes a rotating mechanism 56 made up of, for example, a motor M1; and an elevating mechanism 57 having a ball screw structure 57a and a guide rail 57b. In FIG. 2, reference numerals 58 and 59 denote an O ring and a magnetic seal, respectively, and they are used to rotate and elevate the driving shaft 51 while maintaining airtightness for the chamber 30.

Further, provided on the surface of the temperature control plate 4 is a recess portion 41 having a size suitable for accommodating the rotary stage 5 inside. Thus, the rotary stage 5 is vertically movable between a raised position where it keeps the wafer W above the temperature control plate 4 and a lowered position where it is sunk inside the temperature control plate 4 to thereby allow the wafer W to be placed on the temperature control plate 4. The temperature control plate 4 is provided with a flange portion 40 on its periphery.

As described, the rotary stage 5 is configured such that the wafer W is transferred from the transfer arm A1 or A2 onto the rotary stage 5 by lowering the transfer arm A1 or A2 carrying the wafer W from above the rotary stage 5, and the wafer W is transferred from the rotary stage 5 onto the transfer arm A1 or A2 by raising the transfer arm A1 or A2 from below the rotary stage 5 sustaining the wafer W thereon. Moreover, as the rotary stage 5 sustaining the wafer W thereon is sunk inside the recess portion 41 of the temperature control plate 4, the wafer W is transferred from the rotary stage 5 onto the temperature control plate 4. Further, as the rotary stage 5 is raised from the inside of the temperature control plate 4 sustaining the wafer W thereon, the wafer W is transferred from the temperature control plate 4 onto the rotary stage 5.

Each of the preliminary vacuum chambers 22 and 23 has a position data acquiring unit for detecting a position of a peripheral portion of the wafer W. For example, the position data acquiring unit includes a detector which serves to optically detect the position of the peripheral portion of the wafer W. For instance, the detector may be implemented by using, for example, a line sensor 6 made up of a transmission optical sensor. The line sensor 6 includes a light emitting part 61 and a light receiving part 62, wherein the light emitting part 61 is disposed at, for example, a top portion of the cover 31 to emit light toward a measurement area including the peripheral portion of the wafer W placed on the rotary stage 5. Meanwhile, the light receiving part 62 is disposed at a position on an optical axis of the light emitting part 61 to face the light emitting part 61 so as to receive the light from the light emitting part 61. In this example, the light receiving part 62 is installed at an external side of the bottom wall of the chamber 30.

Since the light emitting part 61 and the light receiving part 62 are disposed such that the temperature control plate 4 is interposed therebetween, a light transmitting part 43 is formed at a region of the temperature control plate 4 where the optical axis from the light emitting part 61 is formed. Likewise, light transmitting parts 30a and 31a are respectively formed at a bottom wall region of the chamber 30 and a region of the cover 31 where the optical axis from the light emitting part 61 is formed. Though the light transmitting parts 30a, 31a and 43 are implemented by cutoff portions in the present example, it is also possible to form those optical axis formation regions with a light transmitting material such as glass and the like. By this configuration, the optical axis for detecting the peripheral portion of the wafer W is formed between the light emitting part 61 and the light receiving part 62, and the locations of the light emitting part 61 and the light receiving part 62 or the widths of the optical axis formation regions are determined so as to allow the peripheral portion of the wafer W mounted on the rotary stage 5 to lie on the optical axis.

In the present embodiment, the position of the peripheral portion of the wafer W is detected before the wafer W is conveyed into the vacuum processing chambers 25 to 28 to be subjected to a vacuum process therein. Specifically, the detection is carried out by emitting light from the line sensor 6 to the peripheral region of the wafer W while rotating the rotary stage 5 sustaining thereon the wafer W at a specific rotational speed. The rotational speed and a detection value from the line sensor 6 are outputted to a control unit 7 of the vacuum processing apparatus to be described later.

Further, a vacuum pump 71 is connected to the preliminary vacuum chamber 22 or 23 via a gas exhaust path 72 and a valve V1 to depressurize the interior of the preliminary vacuum chamber 22 or 23 from a normal pressure atmosphere into a vacuum atmosphere. Further, a gas supply source 73 which supplies a nonreactive gas, for example, a nitrogen gas is also connected to the preliminary vacuum chamber 22 or 23 via a gas supply path 74 and a valve V2 to turn the vacuum atmosphere of the preliminary vacuum chamber 22 or 23 back into the normal pressure atmosphere.

In addition, the control unit 7 incorporated in the vacuum processing apparatus is made up of, for example, a computer, as shown in FIGS. 1 and 2. The control unit 7 has a data processing unit including a program, a memory and a CPU. The program includes commands (each process step) to send control signals from the control unit 7 to individual constituent components of the vacuum processing apparatus and to execute a wafer transfer sequence to be described later. This program is installed in the control unit 7 by being stored in a storage unit 71A such as a computer readable storage medium, e.g., a flexible disk, a compact disk, a hard disk, a MO (Magneto-optical) disk, and the like.

When the opening and closing operations of the gate valves G1 and G2, the transfer of the wafer W between the rotary stage 5 and the first and second transfer arms A1 and A2, the transfer of the wafer W between the rotary stage 5 and the temperature control plate 4, the temperature control of the temperature control plate 4, and a switchover between the normal pressure atmosphere and the vacuum atmosphere inside the chamber 30, the position detection by the line sensor 6, and so forth are performed in the preliminary vacuum chamber 22 or 23, the control unit 7 transmits control signals to the individual components involved.

Figure 4:
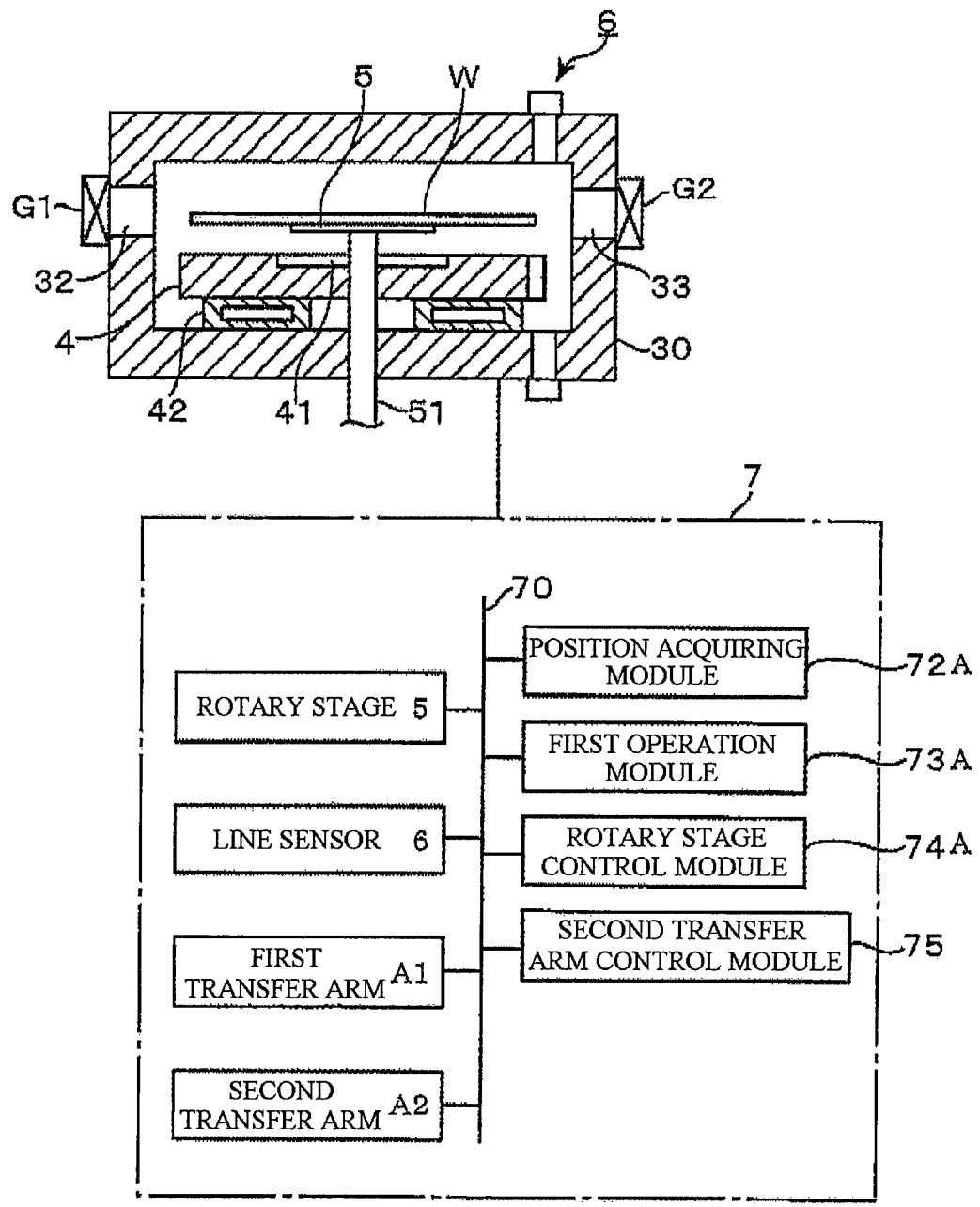
FIG. 4 depicts a configuration view showing an example control unit of the vacuum processing chamber.
Figure 5:
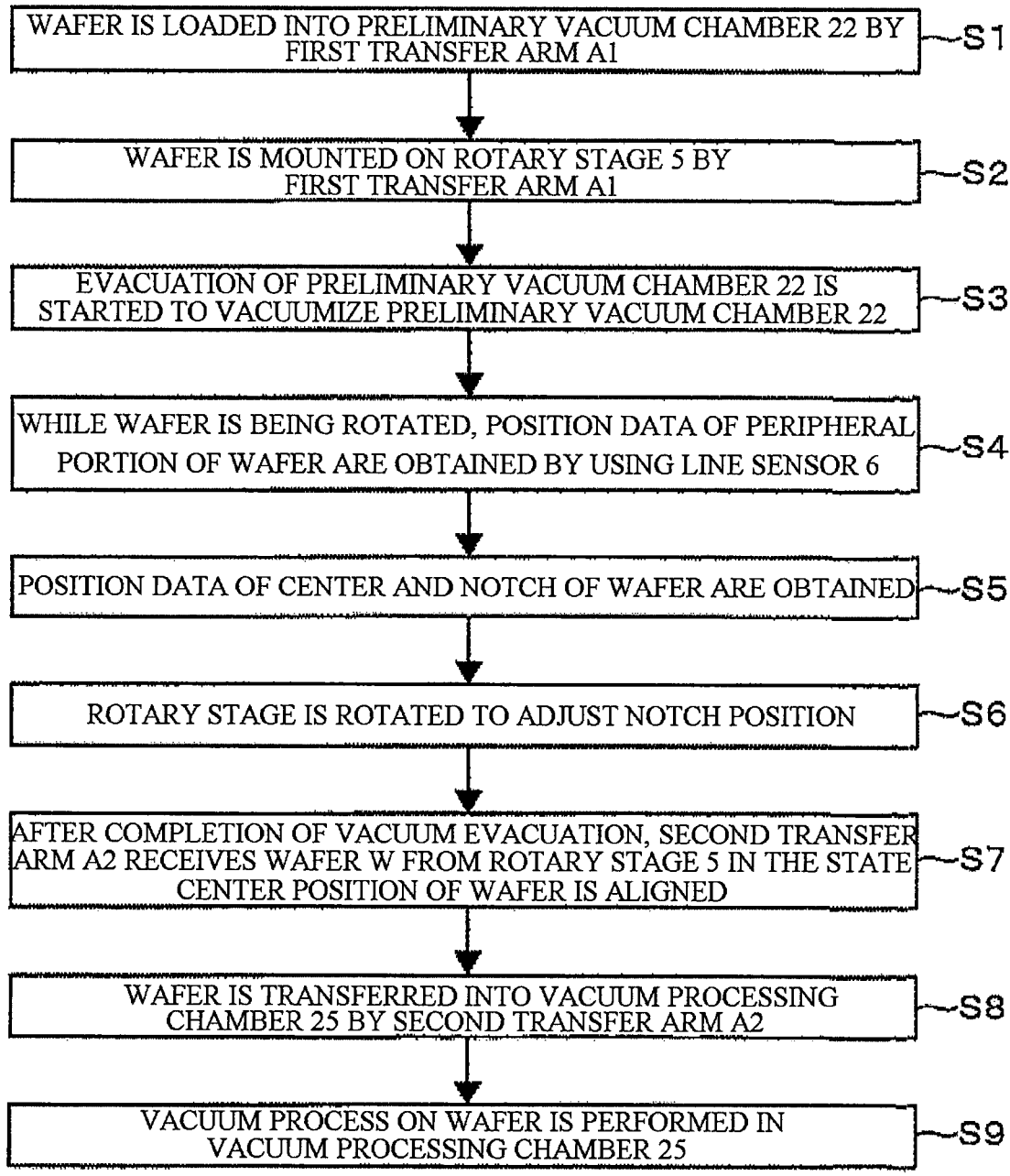
FIG. 5 provides a flowchart to describe an operation of the vacuum processing apparatus.
Figure 6:
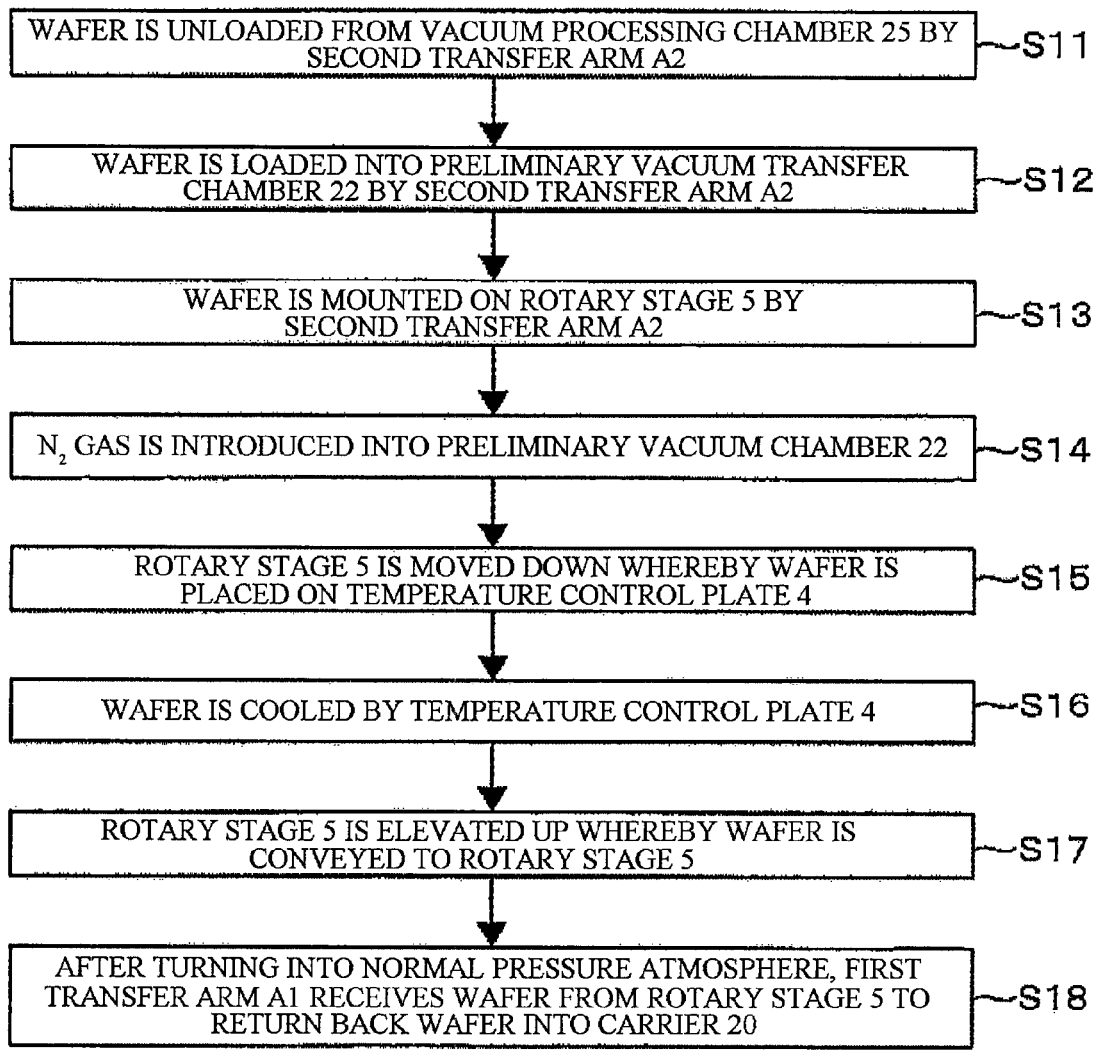
FIG. 6 offers a flowchart to describe an operation of the vacuum processing apparatus.

Further, this program also includes a program for executing a position alignment of the wafer W. Referring to FIG. 4, the program for the wafer position alignment includes a position acquiring module 72A for acquiring data that relate a position of a peripheral portion of the wafer W to a rotational position of the wafer W in a rotational direction based on the rotational speed of the rotary stage 5 and the detection value from the line sensor 6; a first operation module 73A for calculating a center position of the wafer W and a notch position of the wafer W (which indicates a direction of the wafer W) based on the position data of the peripheral portion of the wafer W; a rotary stage control module 74A for controlling a rotation of the rotary stage 5 to adjust the direction of the wafer W based on the notch position; and a second transfer arm control module 75 for controlling the second transfer arm A2 based on the center position of the wafer W so that the wafer W may be conveyed onto mounting member inside one of the vacuum processing chambers 25 to 28 while its center is aligned to the center of the mounting member. In the present example, the position data acquiring unit is comprised of the line sensor 6 constituting the detector and the position acquiring module 72A. In FIG. 4, a reference numeral 70 denotes a bus.

Figure 7A:
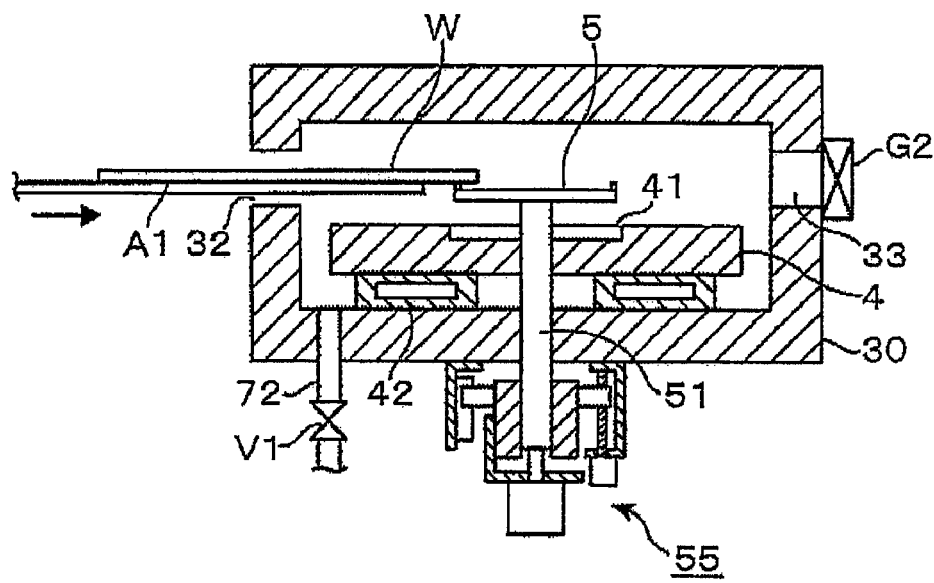
FIGS. 7A and 7B show cross sectional views to describe an operation of the vacuum processing apparatus.

Now, an operation of the vacuum processing apparatus will be explained with reference to FIGS. 5 to 10. First, there will be explained a transfer of a wafer W which is conducted before a vacuum process is performed. After the airtight carrier 20 accommodating a number of wafers W therein is loaded into the first transfer chamber 21, the door GT is opened and a wafer W is taken out of the carrier 20 by the first transfer arm A1. Subsequently, as shown in FIG. 7A, the gate valve G1 of the preliminary vacuum chamber 22 or 23 under a normal pressure atmosphere is opened, and the wafer W is loaded into the preliminary vacuum chamber 22 or 23 through the opening 32 by the first transfer arm A1 (Step S1). At this time, the rotary stage 5 in the preliminary vacuum chamber 22 or 23 is located in the raised position. Then, the wafer W is mounted on the rotary stage 5 by the first transfer arm A1, and the first transfer arm A1 is retreated from the preliminary vacuum chamber 22 or 23 and the gate valve G1 is closed (Step S2). In FIGS. 7A to 10, the cover 31 is omitted for the simplicity of illustration.

Figure 7B:
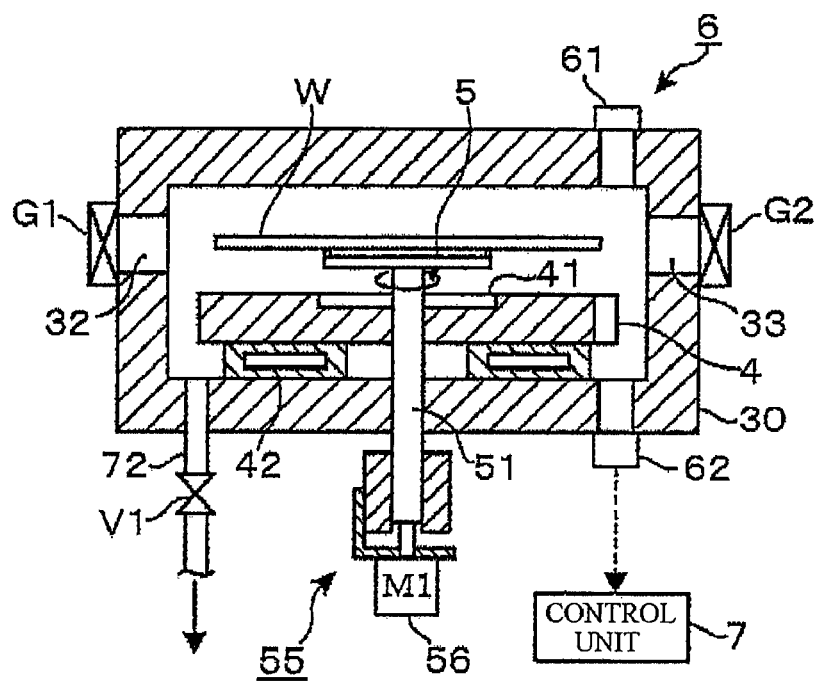

Subsequently, as shown in FIG. 7B, the valve V1 is opened, and evacuation of the preliminary vacuum chamber 22 or 23 is started by the vacuum pump 71 to vacuumize the preliminary vacuum chamber 22 or 23 (Step S3). Further, while the rotary stage 5 is being rotated at a specific rotational speed, the line sensor 6 is operated whereby position data of a peripheral portion of the wafer W are obtained by the position acquiring module 72A (Step S4). Then, a position of a center of the wafer W and a position of a notch thereon are calculated by the first operation module 73A based on the position data of the peripheral portion of the wafer W (Step S5).

Figure 8A:
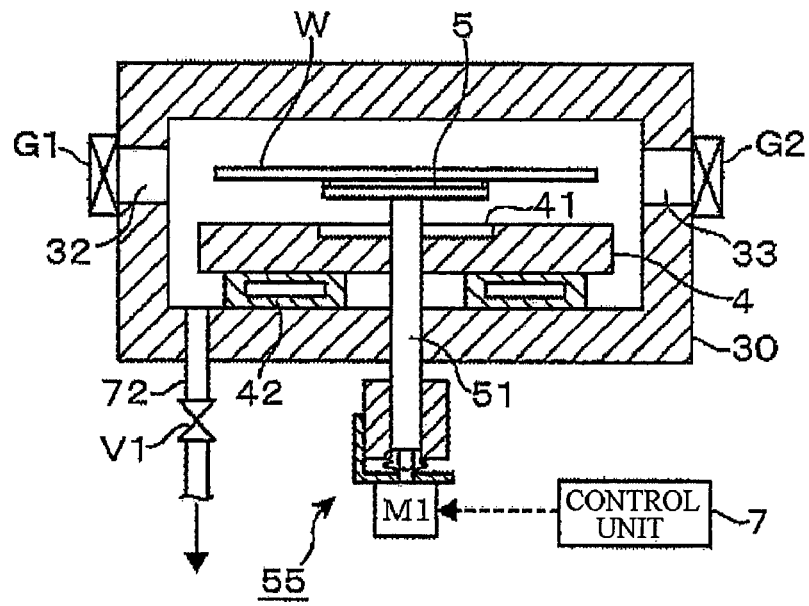
FIGS. 8A and 8B set forth cross sectional views to describe an operation of the vacuum processing apparatus.
Figure 8B:
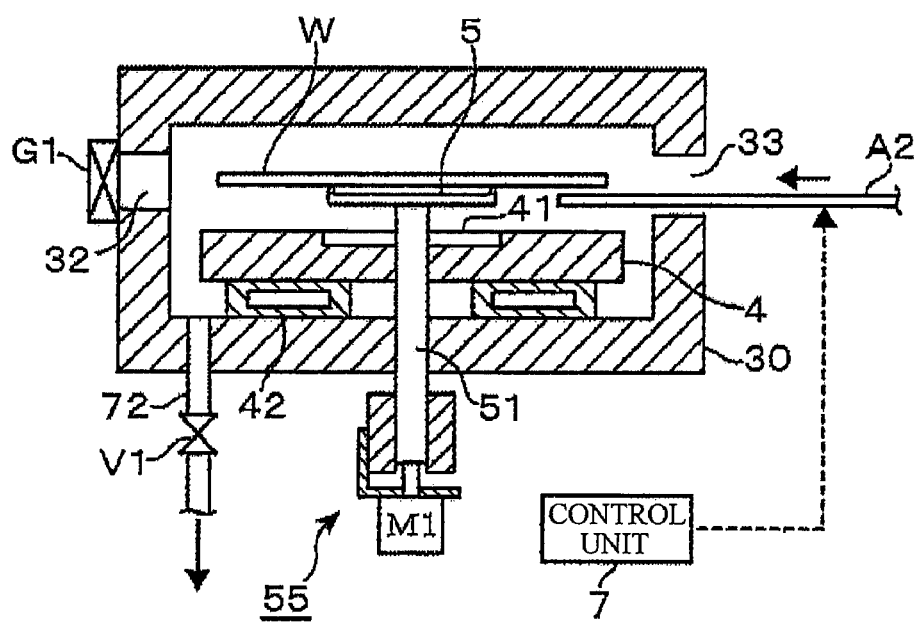

Thereafter, as illustrated in FIG. 8A, the rotary stage 5 is rotated by the rotary stage control module 74A of the control unit 7 to adjust the notch position of the wafer W based on the calculation result of the first operation module 73A (Step S6). Then, as shown in FIG. 8B, after the interior of the preliminary vacuum chamber 22 or 23 is depressurized to a preset vacuum atmosphere, the gate valve G2 is opened, and the second transfer arm A2 is loaded into the preliminary vacuum chamber 22 or 23 through the opening 33. At this time, the second transfer arm control module 75 of the control unit 7 controls the second transfer arm A2 so that the second transfer arm A2 conveys the wafer W onto the mounting member inside one of the vacuum processing chambers 25 to 28 while allowing the center of the wafer W to be aligned to the center of the mounting member based on the calculation result. In the present embodiment, the second transfer arm A2 is controlled such that it receives the wafer W from the rotary stage 5 in the state where the center position of the wafer W is aligned to a mounting position set on the second transfer arm A2 (Step S7).

In the state where the center position and the notch position of the wafer W are adjusted, the wafer W is conveyed from the rotary stage 5 onto the second transfer arm A2. Then, after the second transfer arm A2 is retreated from the preliminary vacuum chamber 22 or 23 through the opening 33, the gate valve G2 is closed. Meanwhile, the wafer W is transferred by the second transfer arm A2 into one of the vacuum processing chambers 25 to 28 (Step S8), and a desired vacuum process is performed in that vacuum processing chamber (Step S9).

Figure 9A:
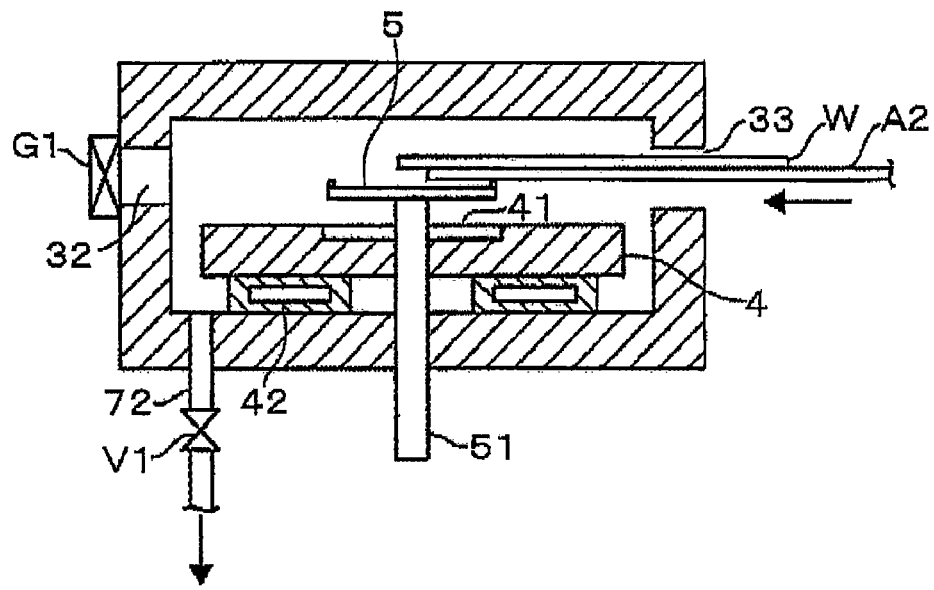
FIGS. 9A and 9B present cross sectional views to describe an operation of the vacuum processing apparatus.

Now, a transfer of the wafer W after the vacuum process will be explained. As illustrated in FIG. 9A, the wafer W processed in one of the vacuum processing chambers 25 to 28 is unloaded therefrom by the second transfer arm A2 (Step S11), and is loaded into the preliminary vacuum transfer chamber 23 or 22 through the opening 33 (Step S12). At this time, the gate valve G2 is opened after the preliminary vacuum chamber 23 or 22 is turned into a vacuum atmosphere, and by the time the gate valve G2 is opened, the rotary stage 5 is already located in the raised position. Then, after the wafer W is mounted on the rotary stage 5 by the second transfer arm A2, the second transfer arm A2 is retreated and the gate valve G2 is closed (Step S13).

Figure 9B:
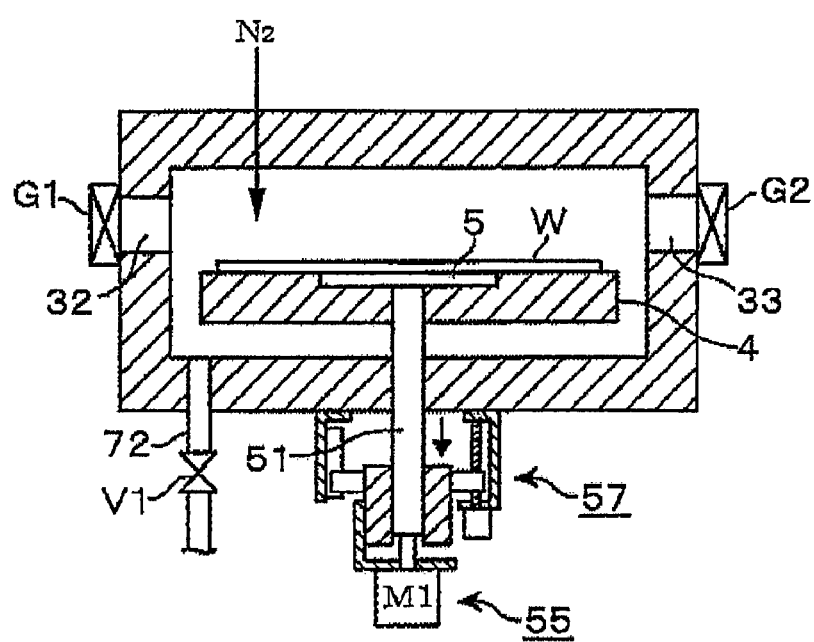

Subsequently, as illustrated in FIG. 9B, the valve V1 is closed, and the valve V2 is opened whereby a nonreactive gas, for example, a nitrogen gas, is introduced from the nonreactive gas supply source 73 into the preliminary vacuum chamber 23 or 22 (Step S14). Meanwhile, the rotary stage 5 is moved down to the lowered position whereby the wafer W is placed on the temperature control plate 4 which is cooled to a specific temperature, for example, about 20° C. to 30° C. (Step S15). Here, the temperature of the wafer W loaded into the preliminary vacuum chamber 23 or 22 after the completion of the vacuum process ranges from, for example, about 200° C. to 400° C. By maintaining this wafer W on the temperature control plate 4 for a specific time period, the wafer W is cooled to a temperature less than, for example, 100° C. (Step S16). In this case, the temperature control plate 4 is used as a cooling plate. Cooling the wafer W to the temperature less than 100° C. is required because a wafer holding portion of the first transfer arm A1 is made of a rubber and the rubber would be deformed by heat if the temperature of the wafer W is about 100° C. or greater and, also, because the wafer W would be contaminated for some reasons if it is accommodated in the airtight carrier 20 while its temperature is about 100° C. or greater.

Figure 10:
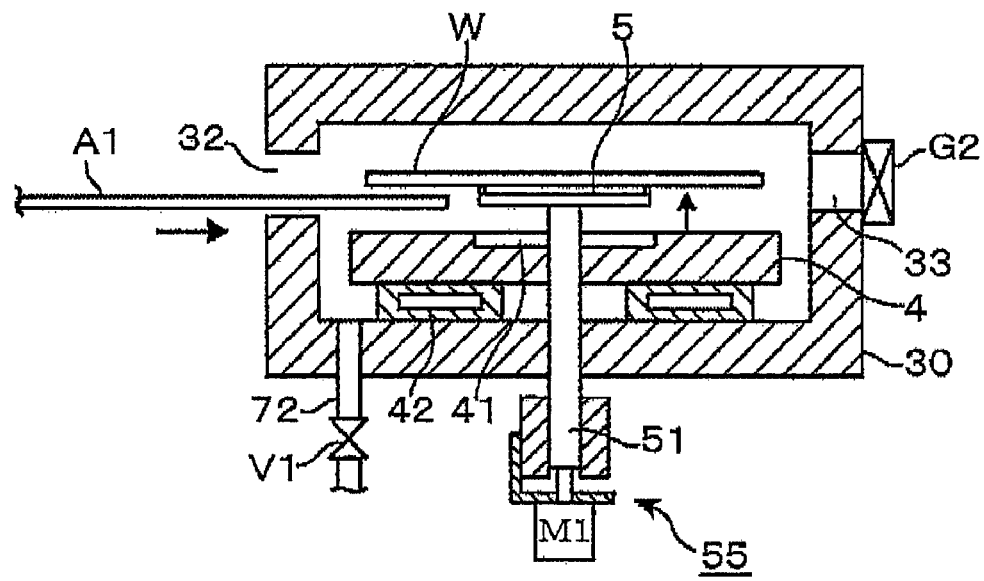
FIG. 10 illustrates a cross sectional view to describe an operation of the vacuum processing apparatus.

Then, as shown in FIG. 10, the preliminary vacuum chamber 23 or 22 is turned into the normal pressure atmosphere, and after the temperature of the wafer W is reduced down to a level less than, e.g., 100° C., the gate valve G1 is opened, and the first transfer arm A1 is loaded into the preliminary vacuum chamber 23 or 22 through the opening 32. At this time, the rotary stage 5 has been elevated up to the raised position while carrying thereon the wafer W which is conveyed from the temperature control plate 4 (Step S17).

Then, the wafer W is transferred from the rotary stage 5 to the first transfer arm A1, and after the first transfer arm A1 is retreated from the preliminary vacuum chamber 23 or 22 through the opening 32 while carrying the wafer W thereon, the gate valve G1 is closed. The wafer W is then returned back into the carrier 20 by the first transfer arm A1 via the first transfer chamber 21 (Step S18).

In the vacuum processing apparatus as described above, the rotary stage 5 is disposed in each of the preliminary vacuum chambers 22 and 23 to be used in transferring the wafer W between the first transfer arm A1 of the first transfer chamber 21 and the second transfer arm A2 of the second transfer chamber 24, and the position data of the peripheral portion of the wafer W are obtained by using the line sensor 6 in the state where the wafer W is mounted on the rotary stage 5 before the wafer W is subjected to a vacuum process. Then, based on the thus obtained position data of the peripheral portion of the wafer W, the position alignment of the center and the notch of the wafer W is carried out.

Therefore, although the position alignment of the wafer W is performed, the first transfer arm A1 only needs to perform the transfer of the wafer W with respect to two positions of the airtight carrier 20 and the rotary stage 5, and the second transfer arm A2 only needs to perform the transfer of the wafer W With respect to two positions of the rotary stage 5 and any one of the vacuum processing chambers 25 to 28. Thus, since the number of access positions of each of the first and the second transfer arms A1 and A2 is only two, loads upon the two transfer arms can be reduced, and the transfer throughput can be improved.

Further, after the wafer W is aligned in the preliminary vacuum chamber 22 or 23, the wafer W is taken from the rotary stage 5 by the second transfer arm A2 and is directly transferred into one of the vacuum processing chambers 25 to 28. Accordingly, after the position alignment is finished, the transfer of the wafer W is performed only one time until the wafer W reaches the wafer mounting member in one of the vacuum processing chambers 25 to 28. Therefore, there is little likelihood that a misalignment of the wafer W is incurred due to the transferring operation, so it is possible to convey the wafer W to the wafer mounting member inside one of the vacuum processing chambers 25 to 28 with a high alignment accuracy for the center and notch positions of the wafer W. Further, since the position alignment of the wafer W is performed while the interior of the preliminary vacuum chamber 22 or 23 is being turned into the vacuum atmosphere from the normal pressure atmosphere, additional processing time is not required for the position alignment even though the position alignment is conducted before the beginning of the vacuum process. Thus, enhancement of the throughput can be achieved in this aspect.

Figure 11:
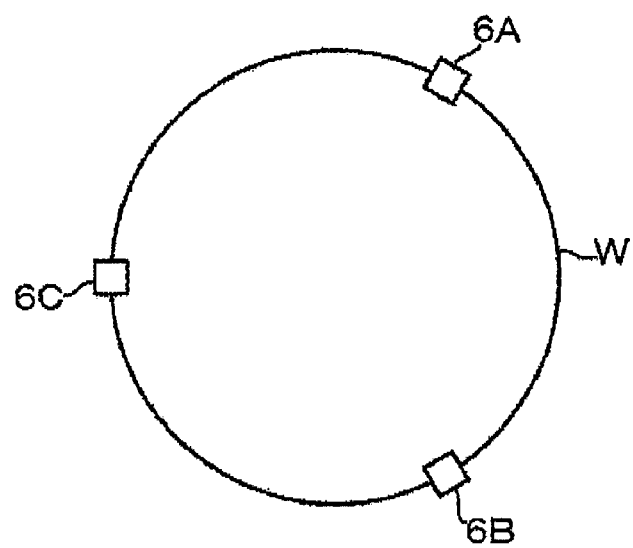
FIG. 11 is a plan view showing a modification of a detection unit of the vacuum processing apparatus.

Now, another embodiment of the present invention will be described for the case of performing a position alignment of the wafer W which is vacuum-processed. As illustrated in FIG. 11, for example, three transmission optical sensors serving as three detectors, for example, line sensors 6A to 6C are disposed along the periphery portion of the wafer W to detect at least three positions on the peripheral portion of the wafer W. Each of the line sensors 6A to 6C includes a light emitting part 61 and a light receiving part 62. Further, a light transmitting part (not shown) is formed at a region of the temperature control plate 4 where an optical axis from the light emitting part 61 is formed.

Detection values from the line sensors 6A to 6C are outputted to the control unit 7, and the control unit 7 includes a second operation module for calculating position data of the center of the wafer W based on the detection values from the line sensors 6A to 6C; and a first transfer arm control module for controlling the first transfer arm A1 based on the calculation result so that the wafer W is mounted on a mounting position set on the first transfer arm A1. Here, as for the meaning of allowing the wafer W to be mounted on the mounting position set on the first transfer arm A1, it implies that the wafer W is mounted on the first transfer arm A1 with its center position aligned to the mounting position on the first transfer arm A1.

Figure 12:
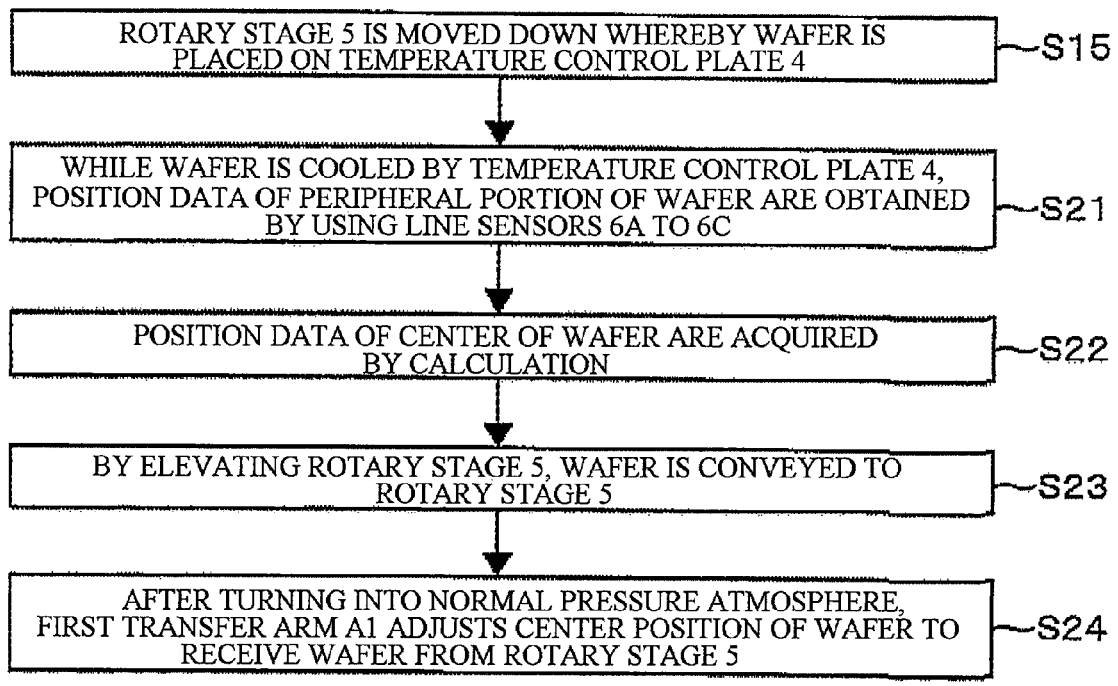
FIG. 12 depicts a flowchart to describe another example operation of the vacuum processing apparatus.

In this embodiment, since the transfer of the wafer W before the vacuum process (steps S1 to S9 in FIG. 5) and the transfer of the wafer W to the temperature control plate 4 after the vacuum process (steps S11 to S15 in FIG. 6) are identical with those described in the above-mentioned embodiment, a transfer of the wafer W after the step S15 will be explained with reference to FIG. 12.

After undergoing the vacuum process, the wafer W is loaded into the preliminary vacuum chamber 23 or 22 and is transferred onto the temperature control plate 4 via the rotary stage 5 (step S15). Concurrently, while the wafer W is cooled by the temperature control plate 4, the three line sensors 6A to 6C are operated for the wafer W on the temperature control plate 4, so that position data of the peripheral portion of the wafer W are obtained (step S21). Then, position data of the center of the wafer W are acquired by the calculation of the second operation module based on the position data of the peripheral portion of the wafer (step S22).

Subsequently, the interior of the vacuum preliminary chamber 23 or 22 is turned into a normal pressure atmosphere, and after the wafer W is cooled to a temperature less than, for example, 100° C., the gate valve G1 is opened and the first transfer arm A1 is loaded into the preliminary vacuum chamber 23 or 22 through the opening 32. At this time, the rotary stage 5 is already elevated to be located in the raised position while carrying thereon the wafer W which has been conveyed from the temperature control plate 4 (step S23). Then, the first transfer arm control module of the control unit 7 controls the first transfer arm A1 so that the first transfer arm A1 receives the wafer W from the rotary stage 5 in the state where the center position of the wafer W is aligned to the mounting position set on the first transfer arm A1. With its center position adjusted, the wafer W is transferred from the rotary stage 5 to the first transfer arm A1 (step S24). After the first transfer arm A1 is retreated from the preliminary vacuum chamber 23 or 22 through the opening 32 while carrying thereon the wafer W, the gate valve G1 is closed. The wafer W is then returned back into the carrier 20 by the first transfer arm A1 via the first transfer chamber 21.

As described, by carrying out the position alignment of the center of the wafer W in the preliminary vacuum chamber 23 or 22 after the vacuum process of the wafer W is finished, the wafer W can be accommodated in the carrier 20 with its position properly aligned, so that it becomes easier to carry out a position alignment of the center position of the wafer W in a subsequent process.

Further, since the position alignment is carried out by using the three line sensors 6A to 6C while the wafer W is mounted on the temperature control plate 4, it is possible to perform the position alignment while cooling the wafer W concurrently by means of the temperature control plate 4. Thus, in comparison with a case in which the cooling and the position alignment of the wafer W are performed individually, additional time is not required for the position alignment. As a result, processing time can be shortened to thereby achieve improvement of a throughput. At this time, since the size of the wafer W varies depending on the temperature thereof, it is required to acquire position data of the peripheral portion of the wafer W from at least three locations on the peripheral portion of the wafer W in order to obtain position data of the center of the wafer with a high accuracy. However, when a variation of wafer size is unlikely to occur, it may be possible to obtain the position data of the center of the wafer W by detecting the position data of the peripheral portion of the wafer W only at two locations thereon.

Moreover, in the event that a throughput is not so important, it is also possible to perform the position alignment of the wafer W by acquiring position data of only one location on the periphery portion of the wafer W after mounting the wafer W on the rotary stage 5, as in the case of performing the position alignment for the wafer W before the vacuum process. In such case, installation of the other two line sensors 6B and 6C is not necessary.

In the embodiments of the present invention described above, it is also possible to carry out preliminary heating for the wafer W prior to the vacuum process in the preliminary vacuum chamber 22 or 23. For example, after the wafer W is conveyed from the first transfer arm A1 onto the rotary stage 5, the rotary stage 5 is lowered, whereby the wafer W is conveyed onto the temperature control plate 4 which is heated up to a preset temperature. Then, by maintaining the wafer W on the temperature control plate 4 for a specific period of time, the wafer W is preliminarily heated. Thereafter, the rotary stage 5 is raised to receive the wafer W from the temperature control plate 4. Then, by rotating the rotary stage 5 above the temperature control plate 4, the position data of the peripheral portion of the wafer W are obtained as described above, and the position alignment is carried out. Then, the wafer W is transferred into one of the vacuum processing chambers 25 to 28 by the second transfer arm A2.

Here, though either one of the preliminary heating process for the wafer W prior to the vacuum process and the cooling process for the wafer W after the vacuum process is performed in the preliminary vacuum chambers 22 and 23, it is also possible to carry out both of the preliminary heating and the cooling process of the wafer prior to and after the vacuum process, respectively. In such case, the preliminary heating process and the cooling process may be carried out in the same one of the preliminary vacuum chambers 22 and 23, or one of the preliminary vacuum chambers 22 and 23 may be used dedicatedly for the preliminary heating process of the wafer W before the vacuum process, while the other one of the preliminary heating chambers 22 and 23 is used dedicatedly for the cooling process of the wafer W after the vacuum process.

Figure 13A:
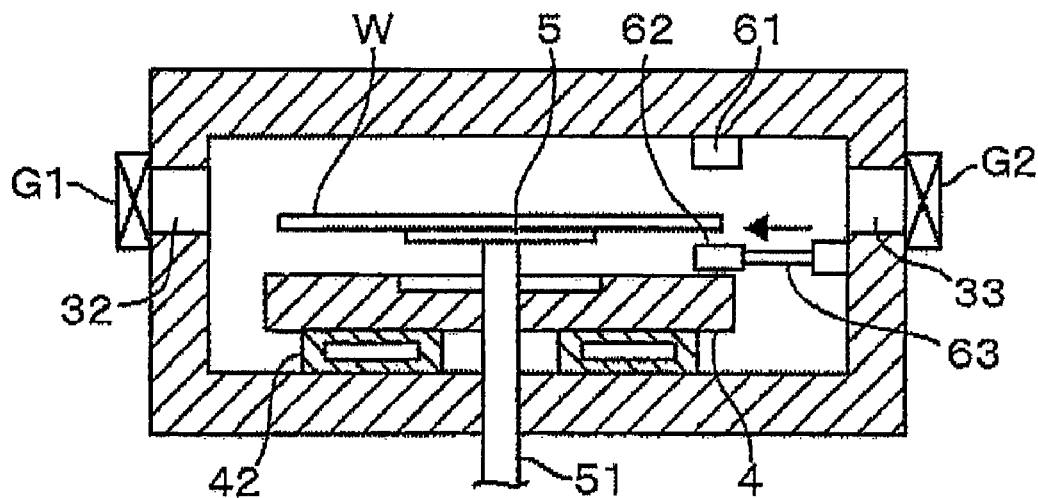
FIGS. 13A and 13B provide cross sectional views showing a modification of the vacuum processing apparatus.
Figure 13B:
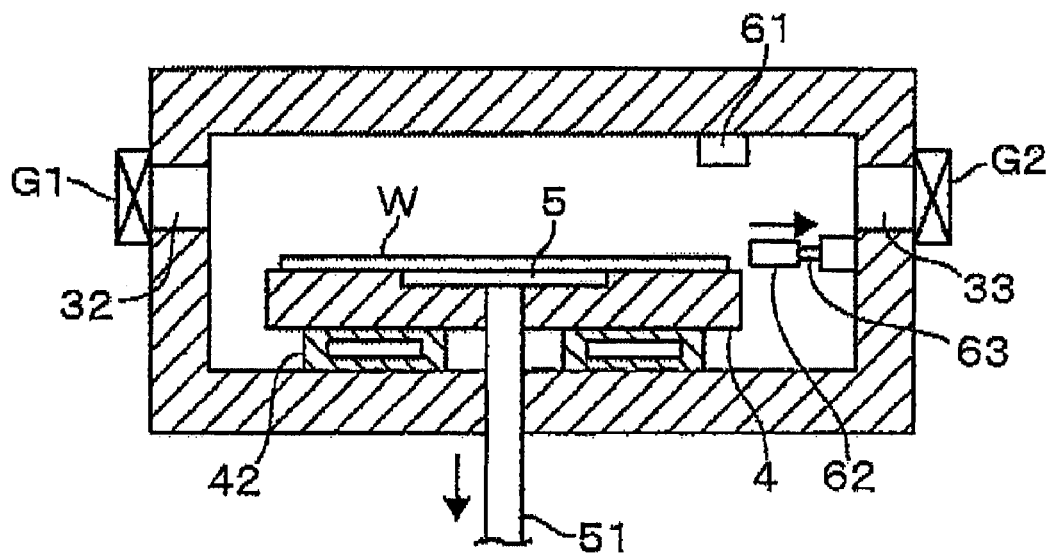
Figure 14:
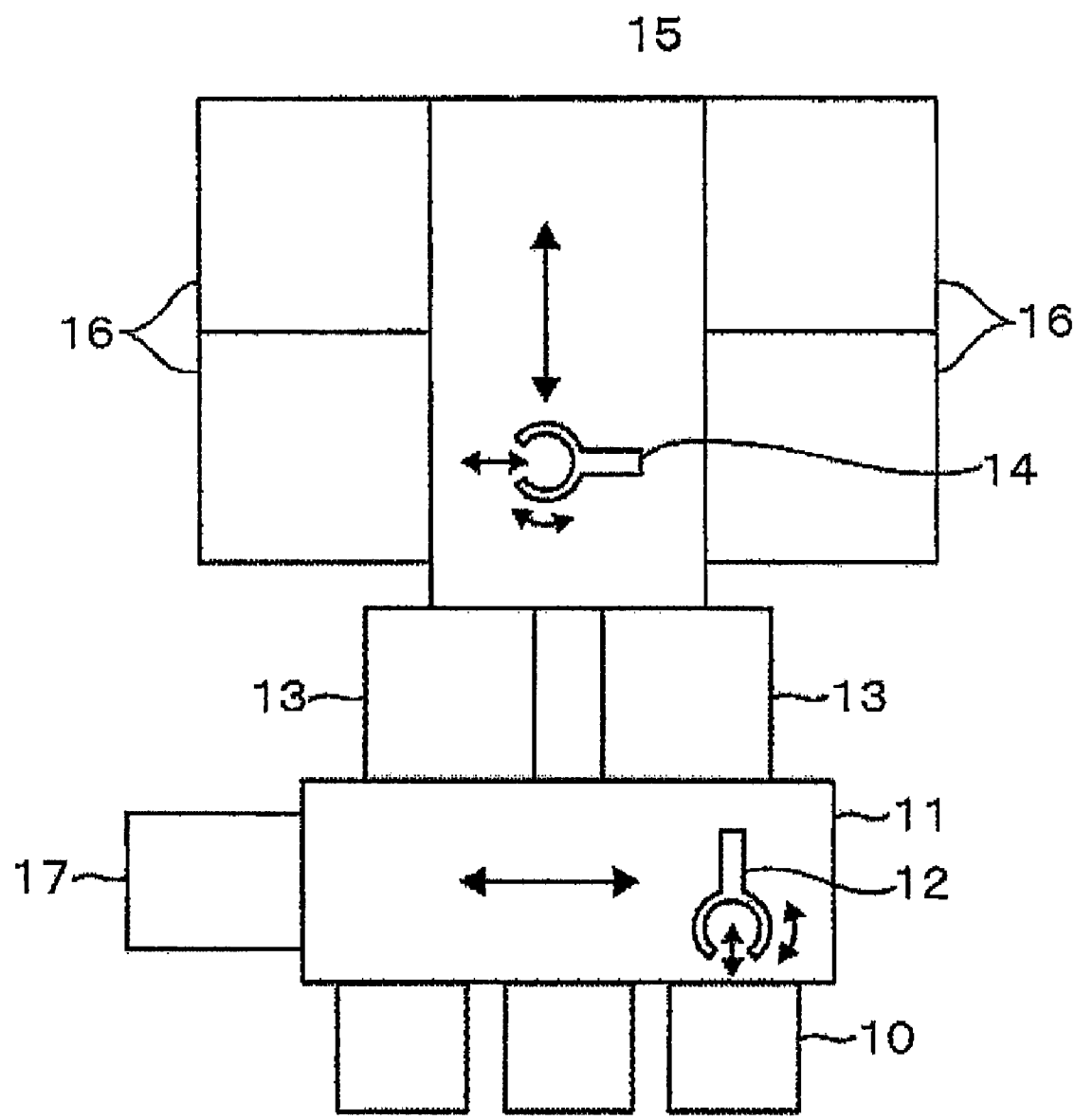
FIG. 14 offers a plan view showing a conventional vacuum processing apparatus.

Further, the light emitting part 61 and the light receiving part 62 of each of the line sensors 6 and 6A to 6C can be installed at an inner side of the cover 31 and at an inner side of the bottom wall of the chamber 30, respectively. Alternatively, as illustrated in FIGS. 13A and 13B, it is also possible to adopt a configuration in which the light receiving part 62 is provided between the temperature control plate 4 and the rotary stage 5 without forming the light transmitting part 43 at the temperature control plate 4. In this case, the light receiving part 62 is configured so as to be movable forward and backward from a sidewall of the chamber 30 by a supporting arm 63. When a detection of a wafer position is performed, the light receiving part 62 is moved forward up to a position where it faces the light emitting part 61, and except when the wafer detection is carried out, the light receiving part 62 is positioned outside the temperature control plate 4. Furthermore, a reflective optical sensor can be used as the detector, and in this case, its light emitting part and light receiving part are installed such that the light receiving part is installed on an optical axis formed by the light emitting part.

Moreover, the position data acquiring unit may be of a type which obtains the position data of the peripheral portion of the wafer W by taking an image of a part of the peripheral portion of the wafer W by means of combining a CCD camera and a light source or of a type which obtains the position data of the peripheral portion of the wafer W from an image by taking the image of the whole part of the wafer W by means of a CCD camera. In such cases, though the wafer W need not be rotated when the position data of its peripheral portion are obtained, it needs to be rotated by the rotary stage 5 when the position alignment of a notch of the wafer W is carried out.

Furthermore, in the above-described embodiments, the acquirement of the position data of the peripheral portion of the wafer W is carried out while the evacuation of the preliminary vacuum chamber 22 or 23 is performed to vacuumize it. Though this method is effective in the aspect of improving a throughput, it is known that the chamber 30 may be deformed if it is under the vacuum atmosphere. Once the chamber 30 is deformed, the optical axis of the line sensor would be deviated, thereby making it impossible to measure the position data of the wafer W accurately. Thus, with regard to the timing for acquiring the position data of the peripheral portion of the wafer W, a process sequence as follows may be available, for example: a sequence of loading the wafer W into the preliminary vacuum chamber 22 or 23 by the first transfer arm A1 to thereby mount it on the rotary stage 5; acquiring the position data of the peripheral portion of the wafer W; starting the evacuation of the preliminary vacuum chamber 22 or 23; and performing the position alignment of the notch of the wafer W during the evacuation process, or a sequence of loading the wafer W into the preliminary vacuum chamber 22 or 23 by the first transfer arm A1; mounting the wafer W on the rotary stage 5; starting the evacuation of the preliminary vacuum chamber 22 or 23; and then acquiring the position data of the peripheral portion of the wafer W after the deformation of the chamber 30 due to the vacuum evacuation is suppressed.

Further, as for the wafer W prior to the vacuum process, the second transfer arm may be controlled based on the position data of the center of the wafer W such that the second transfer arm conveys the wafer W to the mounting member inside the processing chamber, allowing the center of the wafer W to be aligned to the center of the mounting member. However, it is not necessarily required to control the second transfer arm such that the second transfer arm receives the wafer W in the state where the center of the wafer W is aligned to the center of the wafer mounting position on the second transfer arm.

Meanwhile, as for the wafer W after the vacuum process, the first transfer arm is controlled such that it receives the wafer W in the state where the center position of the wafer W is aligned to the mounting position set on the first transfer arm because the wafer W will be returned into the carrier 20 in a subsequence process. However, if another processing unit is connected to the first transfer chamber 21 and the wafer W is conveyed into that processing unit by the first transfer arm A1 before returning the vacuum-processed wafer W back to the carrier 20, the first transfer arm A1 may be controlled based on the position data of the center of the wafer W such that the first transfer arm A1 conveys the wafer W to a wafer mounting member inside the processing unit, allowing the center of the wafer to be aligned to the center of the wafer mounting member.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A vacuum processing apparatus for performing a vacuum process on a wafer, which is a semiconductor substrate, in a vacuum processing chamber, the apparatus capable of transferring the wafer with respect to a preliminary vacuum chamber by a first transfer arm disposed under a normal pressure atmosphere and also capable of transferring the wafer between the preliminary vacuum chamber and the vacuum processing chamber by a second transfer arm disposed in a vacuum transfer chamber, the preliminary vacuum chamber being switchable between a normal pressure atmosphere and a vacuum atmosphere, wherein the preliminary processing apparatus includes:
a temperature control plate for sustaining the wafer thereon while controlling a temperature thereof; and
a rotary stage configured to be revolvable about a vertical axis while sustaining the wafer thereon and vertically movable between a raised position where the rotary stage maintains the wafer above the temperature control plate and a lowered position where the rotary stage is sunk inside the temperature control plate while allowing the wafer to be placed on the temperature control plate, the rotary stage allowing the wafer to be transferred with respect to the first and the second transfer arms, and wherein the vacuum processing apparatus comprises:
a position data acquiring unit for acquiring position data of a peripheral portion of the wafer placed on the rotary stage;
a first operation module for calculating a direction of the wafer based on the position data acquired by the position data acquiring unit; and
a control module for controlling a rotation of the rotary stage to adjust the direction of the wafer based on the calculation result and for controlling the second transfer arm such that the second transfer arm conveys the wafer to a wafer mounting member inside the vacuum processing chamber, and
wherein the position data acquiring unit comprises:
a light emitting part configured to emit light toward a measurement area including the peripheral portion of the wafer placed on the rotary stage, and disposed at one of an upper space of the rotary stage and a lower space of the temperature control plate; and
a light receiving part configured to receive the light from the light emitting part, and disposed at the other of the upper space of the rotary stage and the lower space of the temperature control plate, and
wherein the temperature control plate comprises:
a light transmitting part configured to transmit the light from the light emitting part to the light receiving part.

2. The vacuum processing apparatus of claim 1, wherein the temperature control plate is a cooing plate for cooling the vacuum-processed wafer placed thereon.

3. The vacuum processing apparatus of claim 1, wherein the position data acquiring unit includes a detector for detecting a position of the peripheral portion of the wafer prior to the vacuum process while the wafer is being rotated by the rotary stage, and the position data are data which relate a position of the peripheral portion of the wafer to a rotational position of the wafer in a rotational direction.

4. The vacuum processing apparatus of claim 1, wherein the position data acquiring unit includes a detector for detecting positions of at least three locations on the peripheral portion of the vacuum-processed wafer placed on the temperature control plate, and
the vacuum processing apparatus further comprises:
a second operation module for calculating a center position of the wafer based on the position data acquired by the position data acquiring unit; and
a first transfer arm control module for controlling the first transfer arm based on the calculation result of the second operation module so that the wafer is placed on a mounting position set on the first transfer arm.

5. The vacuum processing apparatus of claim 3, wherein the position data acquiring unit includes a detector for detecting positions of at least three locations on the peripheral portion of the vacuum-processed wafer placed on the temperature control plate, and
the vacuum processing apparatus further comprises:
a second operation module for calculating a center position of the wafer based on the position data acquired by the position data acquiring unit; and
a first transfer arm control module for controlling the first transfer arm based on the calculation result of the second operation module so that the wafer is placed on a mounting position set on the first transfer arm.

6. The vacuum processing apparatus of claim 3, wherein the light receiving part is placed on an optical axis of the light emitting part.

7. The vacuum processing apparatus of claim 4, wherein the light receiving part is placed on an optical axis of the light emitting part.

8. The vacuum processing apparatus of claim 5, wherein the light receiving part is placed on an optical axis of the light emitting part.

9. The vacuum processing apparatus of claim 1, wherein the rotary stage includes a plurality of rod-shaped members extended from a center of rotation in a radial manner.

10. The vacuum processing apparatus of claim 1, wherein the temperature control plate is a heating plate for preliminarily heating the wafer placed thereon prior to the vacuum process.

11. The vacuum processing apparatus of claim 1, wherein the first operation module calculates a center position of the wafer based on the position data, and
the control module controls the second transfer arm to allow a center of the wafer to be aligned to a center of the mounting member based on the calculation result.

\* \* \* \* \*